US010008272B2

(12) United States Patent
Kang et al.

(10) Patent No.: US 10,008,272 B2
(45) Date of Patent: Jun. 26, 2018

(54) OPERATION METHOD OF NONVOLATILE MEMORY SYSTEM THAT INCLUDES ERASE OPERATIONS, FAST ERASE OPERATIONS, PROGRAM OPERATIONS AND FAST PROGRAM OPERATIONS

(71) Applicant: SAMSUNG ELECTRONICS CO., LTD., Suwon-si, Gyeonggi-do (KR)

(72) Inventors: Hee-Woong Kang, Suwon-si (KR); Donghun Kwak, Hwaseong-si (KR); Daeseok Byeon, Seongnam-si (KR); Ju Seok Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days. days.

(21) Appl. No.: 15/587,461

(22) Filed: May 5, 2017

(65) Prior Publication Data

US 2018/0005700 A1    Jan. 4, 2018

(30) Foreign Application Priority Data

Jul. 4, 2016    (KR) ........................ 10-2016-0084324

(51) Int. Cl.
| | | |
|---|---|---|
| *G11C 16/04* | (2006.01) | |
| *G11C 16/16* | (2006.01) | |
| *G11C 16/34* | (2006.01) | |
| *G11C 11/56* | (2006.01) | |
| *G11C 16/08* | (2006.01) | |

(52) U.S. Cl.
CPC .......... *G11C 16/16* (2013.01); *G11C 11/5635* (2013.01); *G11C 16/08* (2013.01); *G11C 16/3445* (2013.01); *G11C 16/0483* (2013.01)

(58) Field of Classification Search
CPC ..... G11C 16/16; G11C 16/3445; G11C 16/10; G11C 16/14; G11C 16/26; G11C 16/08; G11C 11/5635; G11C 16/0483
USPC .......................... 365/185.29, 185.11, 185.24
See application file for complete search history.

(56) References Cited

U.S. PATENT DOCUMENTS

| | | |
|---|---|---|
| 7,679,133 B2 | 3/2010 | Son et al. |
| 8,521,949 B2 | 8/2013 | Xiong et al. |
| 8,553,466 B2 | 10/2013 | Han et al. |
| 8,559,235 B2 | 10/2013 | Yoon et al. |
| 8,654,587 B2 | 2/2014 | Yoon et al. |

(Continued)

FOREIGN PATENT DOCUMENTS

JP    2011022760 A    2/2011

*Primary Examiner* — David Lam
(74) *Attorney, Agent, or Firm* — Volentine, Whitt & Francos, PLLC

(57) ABSTRACT

A nonvolatile memory system includes a nonvolatile memory device and a memory controller that controls the nonvolatile memory device. The nonvolatile memory device includes multiple memory blocks. Each of the memory blocks includes memory cells. Each of the memory cells has any one of an erase state and one of multiple different program states. An operation method of the nonvolatile memory system includes receiving a physical erase command from an external device. The operation method also includes performing a fast erase operation, responsive to the received physical erase command, with respect to at least one memory block so that first memory cells of the at least one memory block have a fast erase state different from the erase state.

19 Claims, 14 Drawing Sheets

(56) References Cited

U.S. PATENT DOCUMENTS

| | | | |
|---|---|---|---|
| 8,797,802 B2* | 8/2014 | Hung | G11C 16/14 |
| | | | 365/185.19 |
| 9,098,401 B2 | 8/2015 | Kasorla et al. | |
| 9,368,218 B2* | 6/2016 | Ziperovich | G11C 16/3445 |
| 2007/0005659 A1 | 1/2007 | Lemoal et al. | |
| 2007/0101049 A1 | 5/2007 | Salessi et al. | |
| 2011/0233648 A1 | 9/2011 | Seol et al. | |
| 2014/0006689 A1 | 1/2014 | Hashimoto | |
| 2015/0089122 A1 | 3/2015 | Oyama | |
| 2015/0149740 A1 | 5/2015 | Shin et al. | |
| 2015/0331620 A1 | 11/2015 | Hohnke | |
| 2016/0034217 A1 | 2/2016 | Kim et al. | |
| 2016/0180942 A1* | 6/2016 | Lee | G11C 16/16 |
| | | | 365/185.11 |

* cited by examiner

OPERATION METHOD OF NONVOLATILE MEMORY SYSTEM THAT INCLUDES ERASE OPERATIONS, FAST ERASE OPERATIONS, PROGRAM OPERATIONS AND FAST PROGRAM OPERATIONS

CROSS-REFERENCE TO RELATED APPLICATIONS

This U.S. non-provisional patent application claims priority under 35 U.S.C. § 119 to Korean Patent Application No. 10-2016-0084324, filed on Jul. 4, 2016 in the Korean Intellectual Property Office, the entire contents of which are hereby incorporated by reference.

BACKGROUND

1. Technical Field

The present disclosure relates to semiconductor memories. More particularly, the present disclosure relates to an operation method of a nonvolatile memory system and an operation method of a nonvolatile memory device.

2. Background Information

A semiconductor memory device is embodied using a semiconductor material such as silicon (Si), germanium (Ge), gallium arsenide (GaAs), indium phosphide (InP), etc. A semiconductor memory device is classified as a volatile memory device or a nonvolatile memory device.

A flash memory, which is a type of nonvolatile memory device, is used as a large-capacity storage medium. A general hard disk can perform an overwriting operation, but a flash memory has a write-after-erase characteristic. Because of this flash memory characteristic, various techniques for effectively managing a flash memory are being developed. A flash memory device or a flash memory system manages data based on a logical address from a host and mapping information for a physical address of a flash memory. In the case where data from the host is deleted, a storage area may be logically managed by removing (erasing) the mapping information.

Standard protocols being used in a flash memory device or a flash memory system define specific commands (e.g., sanitize command, secure erase command) for physically erasing data stored in a flash memory. A flash memory physically (i.e., actually) erases stored data responsive to these specific commands. As storage capacity of a flash memory device or a flash memory system increases, the time spent on the physical erase operation increases. As a result, performance of a flash memory system is degraded.

SUMMARY

Example embodiments of the present disclosure provide an operation method of a nonvolatile memory system that includes a nonvolatile memory device and a memory controller that controls the nonvolatile memory device. The nonvolatile memory device includes multiple memory blocks. Each of the memory blocks includes memory cells. Each of the memory cells has any one of an erase state and one of multiple different program states. The method may include receiving a physical erase command from an external device, and performing a fast erase operation, responsive to the received physical erase command, with respect to at least one memory block so that first memory cells of the at least one memory block have a fast erase state different from the erase state.

Example embodiments of the present disclosure provide an operation method of a nonvolatile memory system that includes a nonvolatile memory device including memory blocks and a memory controller that controls the nonvolatile memory device. The method may include receiving a physical erase command from an external device and performing a first erase operation with respect to first memory blocks responsive to the received physical erase command The method also may include receiving a write command from the external device and performing a second erase operation different from the first erase operation with respect to second memory blocks responsive to the received write command.

Example embodiments of the present disclosure provide an operation method of a nonvolatile memory device that includes memory blocks. The method may include performing a first erase operation with respect to at least one memory block according to a control of an external device. After the first erase operation is completed, the method may include performing a first program operation with respect to the at least one memory block according to a control of the external device. After the first program operation is performed, the method may include performing a second erase operation different from the first erase operation with respect to the at least one memory block according to a control of the external device. After the second erase operation is completed, the method may include performing a second program operation with respect to multiple memory cells of the at least one memory block according to a control of the external device.

BRIEF DESCRIPTION OF THE FIGURES

Embodiments of the present disclosure will be described below in more detail with reference to the accompanying drawings. The embodiments of the present disclosure may, however, be embodied in different forms and should not be constructed as limited to the embodiments set forth herein. Rather, these embodiments are provided so that this disclosure will be thorough and complete, and will fully convey the scope of the present disclosure to those skilled in the art. Like numbers refer to like elements throughout.

DETAILED DESCRIPTION OF THE EMBODIMENTS

Below, embodiments of the present disclosure are described in detail and clearly to such an extent that one of ordinary skill in the art can easily implement the concepts described herein.

Figure 1:
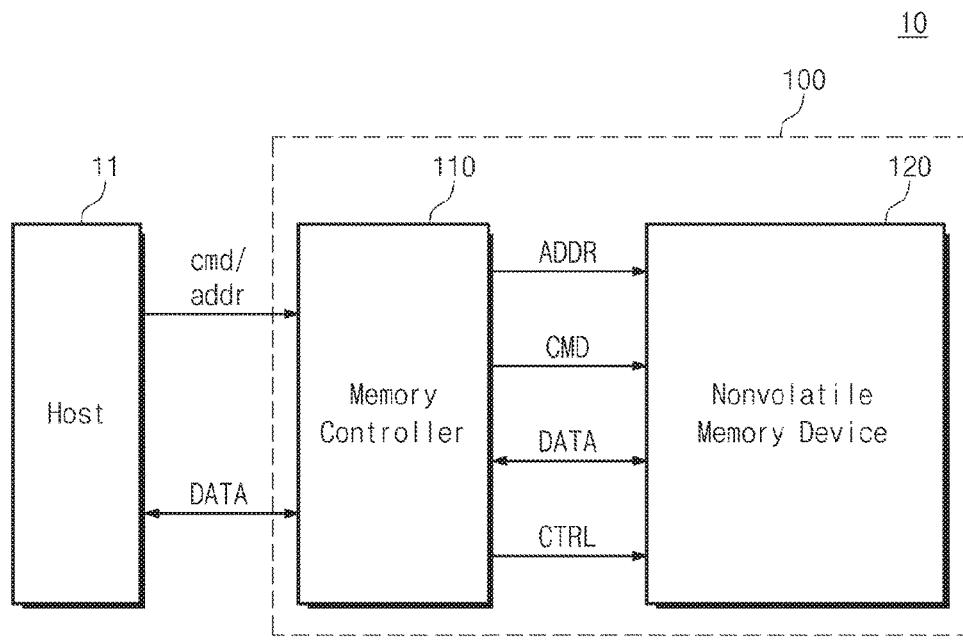
FIG. 1 is a block diagram illustrating a user system in accordance with example embodiments of the present disclosure.

FIG. 1 is a block diagram illustrating a user system in accordance with example embodiments of the present disclosure. Referring to FIG. 1, a user system 10 includes a host 11 and a nonvolatile memory system 100. The user system 10 may include one of a computer, an ultra-mobile PC (UMPC), a workstation, a net-book, a personal digital assistants (PDA), a portable computer, a web tablet, a tablet computer, a wireless phone, a mobile phone, a smart phone, a digital audio recorder, a digital audio player, a digital picture recorder, a digital picture player, a digital video recorder, a digital video player, a device that can transmit and receive information in a wireless environment, and various electronic devices constituting a home network.

The host 11 may control an overall operation of the user system 10. The host 11 may include a central processing unit (CPU), an application processor, etc. The host 11 may provide a command (cmd) and an address (addr) to the nonvolatile memory system 100. The host 11 may exchange data (DATA) with the nonvolatile memory system 100.

The nonvolatile memory system 100 may store data (DATA), or output stored data, in response to a command (cmd) and an address (addr) from the host 11. The nonvolatile memory system 100 and the host 11 may communicate with each other according to a predetermined communication protocol. The predetermined communication protocol may include at least one of various interface protocols such as for a double data rate (DDR) interface, a universal serial bus (USB), a multimedia card (MMC), an embedded MMC (eMMC), a peripheral component interconnection (PCI), a PCI-express, an advanced technology attachment (ATA), a serial-ATA, a parallel-ATA, a small computer small interface (SCSI), an enhanced small disk interface (ESDI), an integrated drive electronics (IDE), a Firewire, a universal flash storage (UFS), a nonvolatile memory-express (NVMe), etc.

The nonvolatile memory system 100 may include a memory controller 110 and a nonvolatile memory device 120. The nonvolatile memory system 100 may be embodied by a large-capacity storage device or large-capacity storage medium such as a USB memory, a memory card, a solid state drive (SSD), etc.

The memory controller 110 may be configured to control the nonvolatile memory device 120 in response to the command (cmd) and the address (addr) from the host 11. The memory controller 110 may transmit a command CMD, an address ADDR, and a control signal CTRL to the nonvolatile memory device 120, and may exchange data (DATA) with the nonvolatile memory device 120. In example embodiments, the command (cmd) and the address (addr) provided from the host 11 may be signals based on a predetermined communication protocol between the host 11 and the memory controller 110. The command CMD, the address ADDR, and the control signal CTRL provided to the nonvolatile memory device 120 may be signals based on a predetermined communication protocol (e.g., a flash interface or a NAND interface) between the memory controller 110 and the nonvolatile memory device 120.

The nonvolatile memory device 120 may include multiple memory blocks. Each of the memory blocks includes multiple memory cells. Each of the memory cells may be a single-level cell (SLC) that stores one data bit or a multi-level cell (MLC) that stores at least two data bits. It is assumed that the nonvolatile memory device 120 is a NAND flash memory device. However, a memory device is not limited thereto, and the nonvolatile memory device 120 may alternatively be (replaced by) a volatile memory such as a static random access memory (SRAM), a dynamic RAM (DRAM), a synchronous DRAM (SDRAM), etc. or a nonvolatile memory such as a read only memory (ROM), a programmable ROM, an electrically programmable ROM, an electrically erasable and programmable ROM, a flash memory, a phase-change RAM (PRAM), a magnetic RAM (MRAM), a resistive RAM (RRAM), a ferroelectric RAM (FRAM), etc.

In example embodiments, the address (addr) provided from the host 11 may be a logical address, and the address ADDR provided from the memory controller 110 may be a physical address. The memory controller 110 may translate the logical address (addr) from the host 11 into the physical address ADDR or may translate the physical address ADDR into the logical address (addr). The translation operation described above may be performed by a flash translation layer (FTL) and may be managed through a mapping table.

In example embodiments, the memory controller 110 may perform an erase operation under the control of the host 11. The erase operation may include a physical erase operation that directly erases (or deletes) data stored in the nonvolatile memory device 120, or a logical erase operation that erases only mapping information of the mapping table without physically erasing data. In other words, the physical erase operation indicates an operation of physically (actually) deleting data stored in a selected memory block so that data stored in the selected memory block is not read out. That is, since data logically erased actually exists in the nonvolatile memory device 120, the data may be read out from the nonvolatile memory device 120. However, since data physically erased is physically erased in the nonvolatile memory device 120, the data may not be read out from the nonvolatile memory device 120.

The memory controller 110 may perform a physical erase operation or a logical erase operation in response to a specific erase command from the host 11. The specific erase command may include erase commands such as a sanitize command, a secure command, a TRIM command, a delete command, an unmap command, etc. The memory controller 110 may perform a logical erase operation or a physical erase operation according to the aforementioned command type.

For brevity of description, it is assumed that the memory controller 110 receives a physical erase command from the host 11, and performs a physical erase operation in response to the received physical erase command Here, the physical erase command may be a predetermined command based on a specific communication protocol, such as a sanitize command and a secure command, a manufacturer command, or combinations thereof.

The memory controller 110 may perform a physical erase operation with respect to a selected memory block among the memory blocks of the nonvolatile memory device 120 in response to the physical erase command from the host 11. In this case, unlike a general physical erase operation, the physical erase operation may include a fast erase operation and a fast program operation.

For example, the general physical operation may indicate an operation of erasing the selected memory block so that memory cells of the selected memory block have an erase state. Unlike this, the fast erase operation may indicate an operation of erasing the selected memory block so that memory cells of the selected memory block have a threshold voltage state which is different from the erase state. In this case, the different threshold voltage state may have a threshold voltage higher than the erase state.

Unlike a general program operation, the fast program operation may indicate an operation of programming the memory cells of the selected memory block to have a fast program state. The fast program state may be a program state different from program states normally programmed. The fast program operation may be performed faster than the general program operation. The fast erase operation and the fast program operation will be described with reference to views below in further detail.

As described above, the memory controller 110 may rapidly erase data stored in the selected memory block by performing the fast erase operation and the fast program operation in response to the physical erase command from the host 11. Since data in the selected memory block is physically (actually) deleted, data may not be read out from the selected memory block. That is, requirements for the physical erase command from the host 11 may be satisfied. Consequently, a nonvolatile memory system having improved reliability and improved performance is provided.

Figure 2:
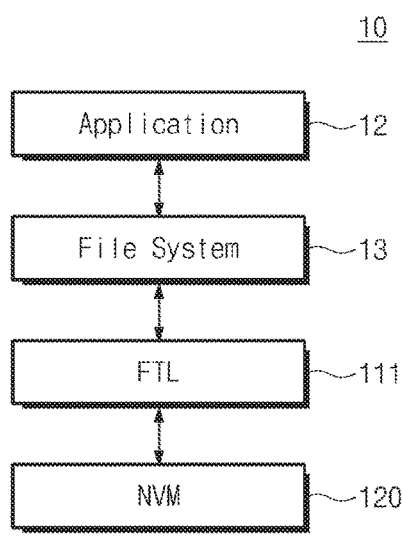
FIG. 2 is a block diagram illustrating a software layer of the user system of FIG. 1.

FIG. 2 is a block diagram illustrating a software layer of the user system of FIG. 1. Referring to FIGS. 1 and 2, a software layer of the user system 10 may include an application 12, a file system 13, and a flash translation layer (FTL) 111. The application 12 and the file system 13 may be a software layer driven on the host 11. The application 12 indicates various application programs driven in an external device.

When a file or data used by the application 12 is stored in the nonvolatile memory device 120, the file system 13 performs a function of organizing the file or data used by the application stored in the nonvolatile memory device 120. For example, the file system 13 may provide the file or the data to the nonvolatile memory system 100. The file system 13 may have a different form depending on an external operating system (OS). The file system 13 may include a file allocation table (FAT), a FAT32, a NT file system (NTFS), a hierarchical file system (HFS), a journaled file system2 (JSF2), an XFS, an on-disk structure-5 (ODS-5), a UDF, a ZFS, a unix file system (UFS), an ext2, an ext3, an ext4, a reiserFS, a reiser4, an ISO 9660, a Gnome VFS, a BFS, or a WinFS.

The FTL 111 may provide an interface between the host 11 and the nonvolatile memory device 120 so that the nonvolatile memory device 120 is effectively used. For example, the FTL 111, as described above, may perform a translation operation between the logical address (addr) and the physical address ADDR. The FTL 111 manages the address translation operation through the mapping table. The FTL 111 may perform an operation such as a garbage collection GC, a wear leveling, etc.

Figure 3:
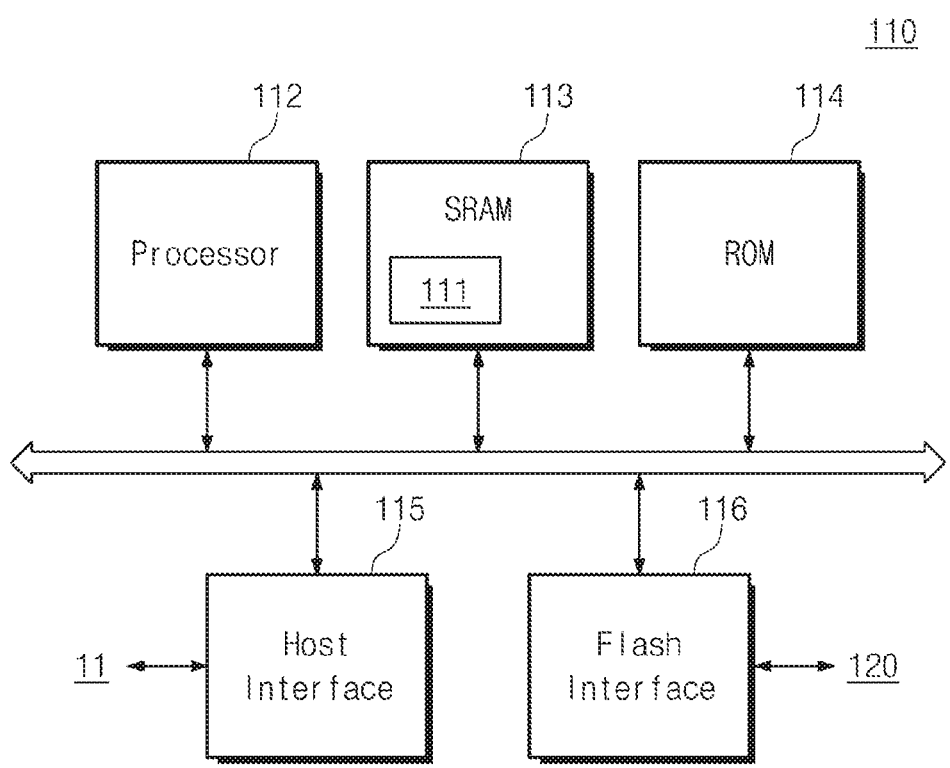
FIG. 3 is a block diagram illustrating a memory controller of FIG. 1 in detail.

FIG. 3 is a block diagram illustrating a memory controller of FIG. 1 in detail. Referring to FIGS. 1 and 3, the memory controller 110 includes a processor 112, a SRAM 113, a ROM 114, a host interface 115, and a flash interface 116.

The processor 112 may perform an overall operation of the memory controller 110. The SRAM 113 may be used as a buffer memory, a cache memory, or an operation memory of the memory controller 110. The FTL 111 may be provided in software form and may be stored in the SRAM 113. The FTL 111 stored in the SRAM 113 may be driven by the processor 112. The ROM 114 may store various information required when the memory controller 110 operates in a firmware form.

The memory controller 110 may communicate with the host 11 through the host interface 115. The host interface 115 may include interfaces based on the various communication protocols described with reference to FIG. 1. The memory controller 110 may communicate with the nonvolatile memory device 120 through the flash interface 116.

Figure 4:
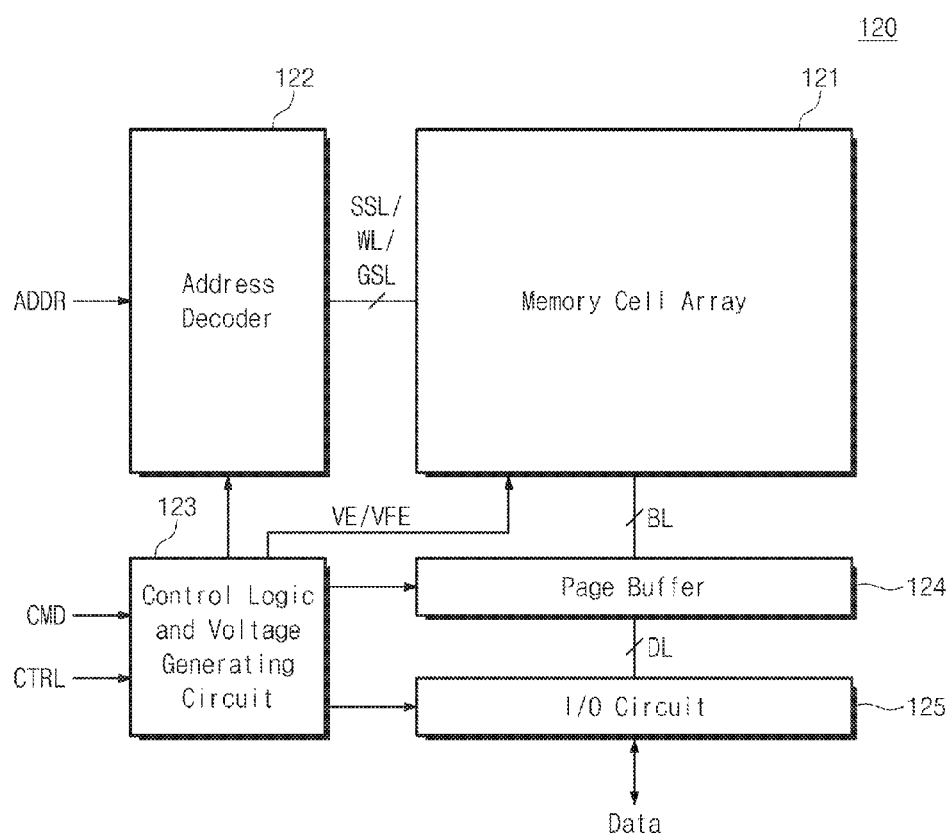
FIG. 4 is a block diagram illustrating a nonvolatile memory device of FIG. 1 in detail.

FIG. 4 is a block diagram illustrating a nonvolatile memory device of FIG. 1 in detail. Referring to FIG. 4, the nonvolatile memory device 120 includes a memory cell array 121, an address decoder 122, a control logic and voltage generating circuit 123, a page buffer 124, and an input/output circuit 125.

The memory cell array 121 includes multiple memory blocks and each of the memory blocks may include multiple memory cells. Each of the memory cells may be connected to one another through word lines WL. Each of the memory cells may be a single level cell (SLC) that stores 1 bit data or a multi-level cell (MLC) that stores at least 2 bit data.

The address decoder 122 may be connected to the memory cell array 121 through string select lines SSL, word lines WL, and ground select lines GSL. The address decoder 122 may receive an address ADDR from the memory controller 110. The address decoder 122 may decode the received address ADDR and may select at least one word line among the word lines WL based on the decoded address. The address decoder 122 may control a voltage of the selected word line.

The control logic and voltage generating circuit 123 may receive a command CMD and a control signal CTRL from the memory controller 110 and may control the address decoder 122, the page buffer 124, and the input/output circuit 125 in response to the received signals.

The control logic and voltage generating circuit 123 may generate various voltages required when the nonvolatile memory device 120 operates. For example, the control logic and voltage generating circuit 123 may generate various voltages such as multiple different select read voltages, multiple different unselect read voltage, multiple different program voltages, multiple different pass voltages, multiple different program verify voltages, multiple different erase voltages, multiple different word line erase voltages, multiple different erase verify voltages, etc. The control logic and voltage generating circuit 123 may generate an erase voltage VE and may provide the generated erase voltage VE or a fast erase voltage VFE to a substrate (not illustrated) of the memory cell array 121. The erase voltage VE indicates a voltage applied to the substrate in a general erase operation. The fast erase voltage VFE indicates a voltage applied to the substrate in a fast erase operation.

The page buffer 124 is connected to the memory cell array 121 through bit lines BL. The page buffer 124 may temporarily store data to be stored in the memory cell array 121 or data read from the memory cell array 121.

The input/output circuit 125 is connected to the page buffer 124 through data lines DL and may exchange data DATA with the page buffer 124 through the data lines DL. The input/output circuit 125 may transmit data DATA to the memory controller 110 or may receive data DATA from the memory controller 110 according to a control of the control logic and voltage generating circuit 123.

Figure 5:
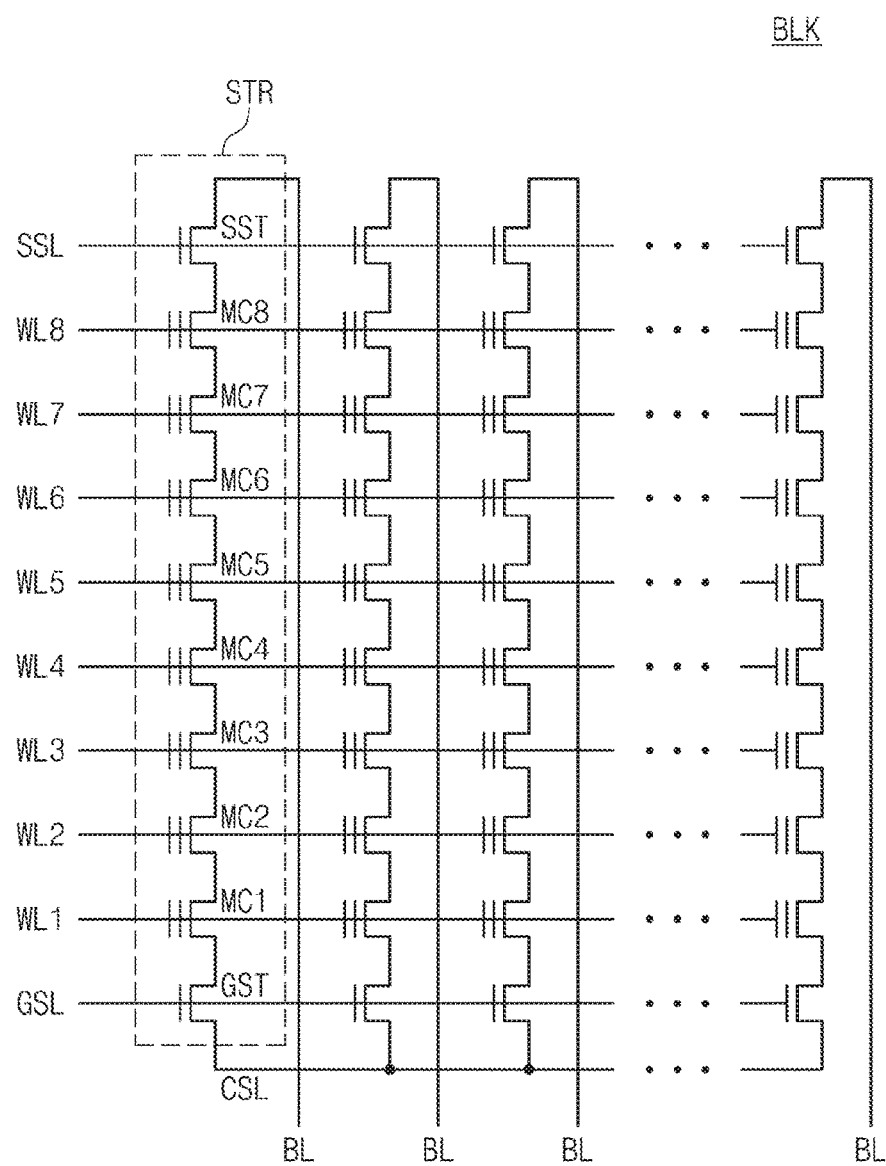
FIG. 5 is a circuit diagram illustrating one of multiple memory blocks included in a memory cell array of FIG. 4.

FIG. 5 is a circuit diagram illustrating one of multiple memory blocks included in a memory cell array of FIG. 3. A memory block BLK is described with reference to FIG. 5 but memory blocks are not limited thereto. Other memory blocks have a structure similar to the memory block BLK.

Referring to FIG. 5, the memory block BLK includes multiple strings STR. Each of the strings STR may include multiple memory cells (MC1 to MC8), a string select transistor SST, and a ground select transistor GST. The string select transistor SST, the memory cells (MC1 to MC8), and the ground select transistor GST are serially connected. One end of the string select transistor SST is connected to a bit line BL. One end of the ground select transistor GST is connected to a common source line CSL. The string select transistor SST is connected to a string select line SSL. The ground select transistor GST is connected to a ground select line GSL. The memory cells (MC1 to MC8) are connected to multiple word lines WL respectively.

The memory block BLK in FIG. 5 is illustrative and reflects a technical spirit of the present disclosure. Memory blocks ares not limited thereto. Each of the strings STR of the memory block BLK may further include a dummy string select transistor, a dummy ground select transistor, or other memory cells besides the memory cells (MC1 to MC8). The memory block BLK may also include a three-dimensional memory structure stacked in a direction perpendicular to the substrate.

Figure 6:
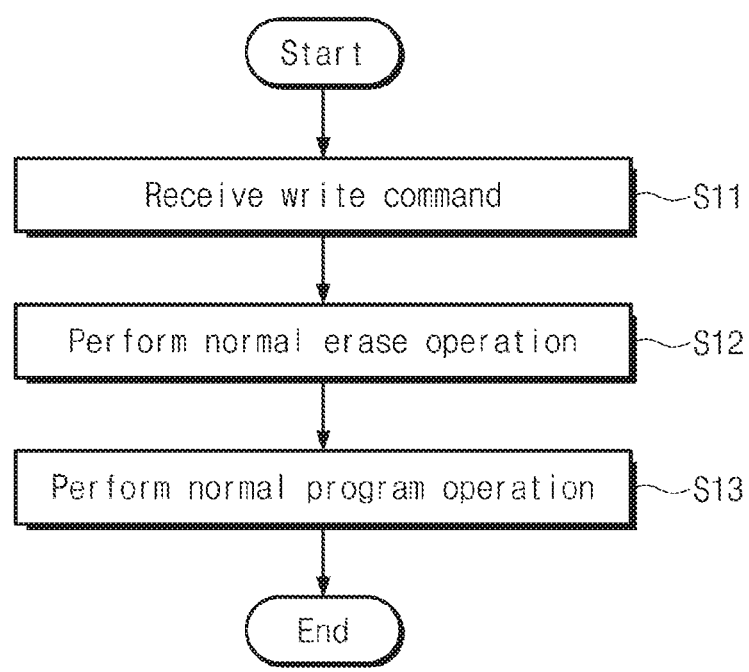
FIG. 6 is a flowchart illustrating an operation of a nonvolatile memory system of FIG. 1.

FIG. 6 is a flowchart illustrating an operation of a nonvolatile memory system of FIG. 1. Referring to FIGS. 1 and 6, in an operation S11, the memory controller 110 may receive a write command from the host 11. For example, the host 11 may provide the write command (cmd) and the address (addr) to the nonvolatile memory system 100 to store data in the nonvolatile memory system 100.

In an operation S12, the memory controller 110 may perform a general (normal) erase operation with respect to the memory block BLK. For example, the nonvolatile memory device 120 may have a write-after-erase characteristic. That is, to write data in the nonvolatile memory device 120, the nonvolatile memory device 120 may erase the selected memory block BLK under the control of the memory controller 110 and then program data in the erased memory block BLK. The nonvolatile memory device 120 may perform a general erase operation with respect to the memory block BLK so that memory cells of the memory block BLK have an erase state E under the control of the memory controller 110.

In example embodiments, the memory controller 110 may provide a general erase command for the general erase operation described above to the nonvolatile memory device 120. The nonvolatile memory device 120 may perform the general erase operation described above in response to a general erase command. The general erase command may be a signal predefined by an interface between the memory controller 110 and the nonvolatile memory device 120.

In an operation S13, the memory controller 110 may perform a general (normal) program operation on the selected memory block BLK. For example, the memory controller 110 may perform a general program operation on multiple memory cells of the memory block BLK. In this case, some (all or fewer than all) memory cells may be memory cells having an erase state E or a specific program state of multiple different possible program states. That is, the nonvolatile memory device 120 may program so that each of multiple memory cells connected to one word line (e.g., a selected word line) of the memory block BLK has any one of the erase state E and first through seventh program states under the control of the memory controller 110.

In example embodiments, the memory controller 110 may provide a general program command for the general program operation described above to the nonvolatile memory device 120. The nonvolatile memory device 120 may perform the general program operation described above in response to a general program command The general program command may be a signal predefined by an interface between the memory controller 110 and the nonvolatile memory device 120.

In example embodiments, the operation S12 may be omitted depending on a state of the memory block BLK. For example, in the case where memory cells connected to a selected word line of the memory block BLK already have an erase state E, a general erase operation of the S12 may be omitted.

Figure 7:
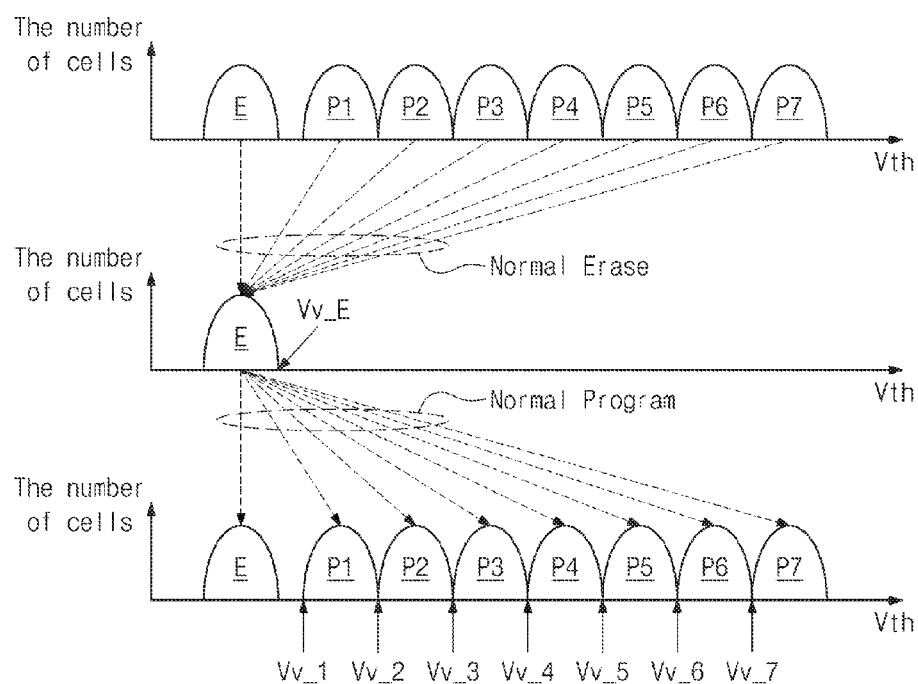
FIGS. 7 to 9 illustrate views for explaining an operation of FIG. 6.
Figure 8:
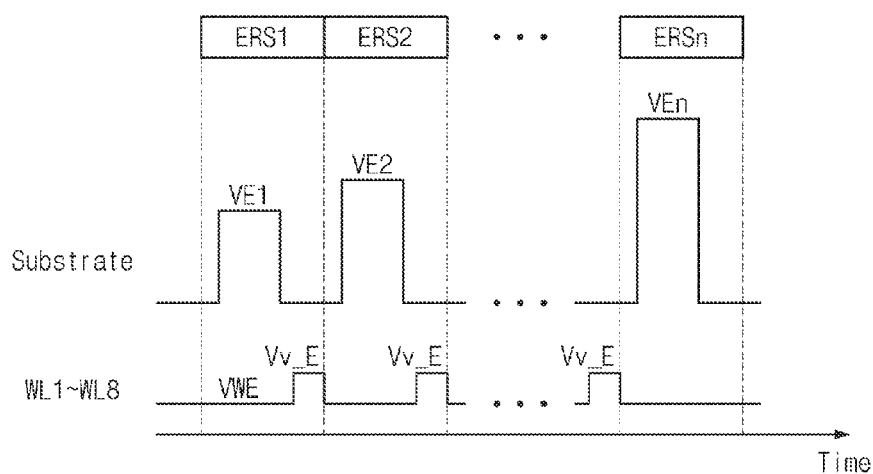
Figure 9:
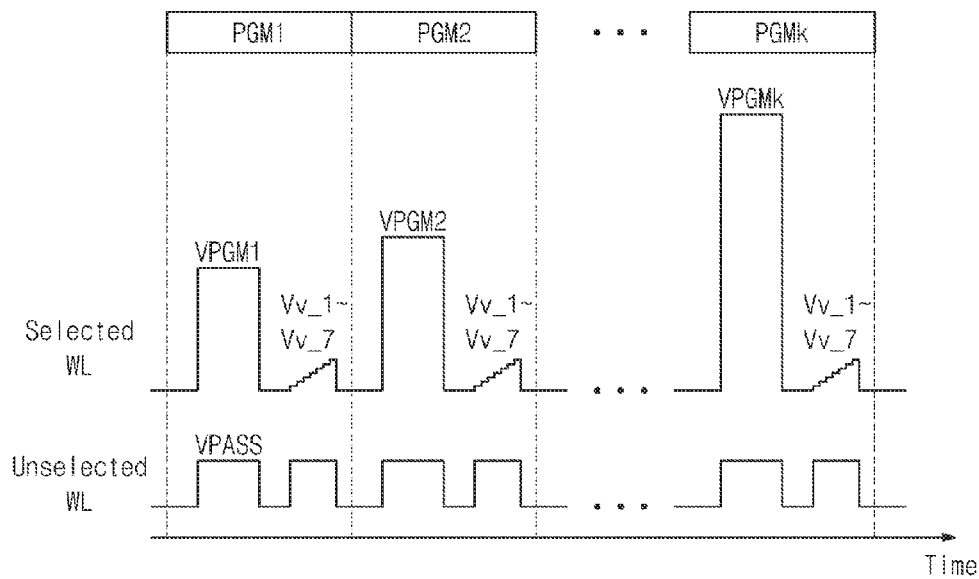

FIGS. 7 to 9 are views for explaining an operation of FIG. 6. Referring to FIGS. 7 to 9, a general erase operation and a general program operation are described. X axes of graphs of FIG. 7 indicate a threshold voltage of memory cells and Y axes of graphs of FIG. 7 indicate the number of memory cells. X axes of graphs of FIGS. 8 and 9 indicate a time and Y axes of graphs of FIGS. 8 and 9 indicate a voltage level. For brevity of description, it is assumed that the memory block BLK is a memory block selected to perform a program operation. It is also assumed that each memory cell is TLC that stores 3-bit data. However, memory blocks and memory cells are not limited thereto.

Referring to FIGS. 1 and 6 to 9, the memory controller 110 may perform a general erase operation with respect to the memory block BLK in response to a write command (cmd). For example, each of memory cells of the memory block BLK may have any one of an erase state E and first to seventh program states P1 to P7. The memory controller 110 may control the nonvolatile memory device 120 so that memory cells of the memory block BLK have an erase state E.

In example embodiments, a general erase operation, as illustrated in FIG. 8, may be performed in an incremental step pulse erasing (ISPE) scheme. That is, the general erase operation may include multiple erase loops ERS1 to ERSn. In the erase loops ERS1 to ERSn, erase voltages VE1 to VEn are applied to a substrate respectively and then an erase verify voltage Vv_E are applied to word lines.

More specifically, in the first erase loop ERS1, the first erase voltage VE1 is applied to the substrate. At this time, a word line erase voltage VWE is applied to word lines connected to the memory block BLK. The word line erase voltage VWE may have a predetermined level (e.g., ground level, positive level, or negative level). In example embodiments, the word line erase voltage VWE may be different depending on a physical location of the word line, a program or erase speed of memory cells, or a physical characteristic.

After that, the erase verify voltage Vv_E is applied to word lines (WL1 to WL8) connected to the memory block BLK. In example embodiments, the erase verify voltage Vv_E may be an upper bound value of a threshold voltage distribution of the erase state E. The nonvolatile memory device 120 may verify an erase state of the memory block BLK by applying the erase verify voltage Vv_E to the word lines (WL1 to WL8) connected to the memory block BLK.

In the case where the memory block BLK is erased, a general erase operation is finished and next erase loops are not performed. In the case where the memory block BLK is not erased, a next erase loop (i.e., the second erase loop ERS2) is performed. In the second erase loop ERS2, the second erase voltage VE2 is applied to the substrate and then the erase verify voltage Vv_E is applied to the word lines (WL1 to WL8). The second erase voltage VE2 is higher than the first erase voltage VE1 by a predetermined level. That is, as the erase loops are performed, the erase voltage VE being applied may increase by a predetermined level. Memory cells of the memory block BLK may have an erase state E by repeatedly performing the erase loops.

After a general erase operation with respect to the memory block BLK is completed, the memory controller 110 may perform a general program operation. The general program operation may be performed with respect to some, e.g., memory cells of the memory block BLK. For example, the general program operation may be performed with respect to memory cells connected to a selected word line of the memory block BLK.

The memory controller 110 may control the nonvolatile memory device 120 so that each of memory cells connected to one word line (i.e., a selected word line) of the memory block BLK has any one of the erase state E and the first through seventh program states.

A general program operation may be performed in an incremental step pulse programming (ISPP) method. As illustrated in FIG. 9, in a general program operation, the nonvolatile memory device 120 may perform multiple program loops (PGM1 to PGMk) according to a control of the memory controller 110.

In the first program loop PGM1, the nonvolatile memory device 120 may apply the first program voltage VPGM1 to the selected word line and apply a pass voltage VPASS to an unselected word line to change a threshold voltage of memory cells connected to the selected word line. After that, the nonvolatile memory device 120 may apply first through seventh verify voltages (Vv_1 to Vv_7) to the selected word line and apply a pass voltage VPASS to an unselected word line to verify a program state of memory cells connected to the selected word line. The first through seventh verify voltages (Vv_1 to Vv_7), as illustrated in FIG. 7, may be verify voltages for verifying the first through seventh program states (P1 to P7) respectively.

In the case where memory cells are not normally programmed, the nonvolatile memory device 120 performs the second program loop PGM2. In the second program loop PGM2, the nonvolatile memory device 120 applies the second program voltage VPGM2 to the selected word line and applies the pass voltage VPASS to the unselected word line. In this case, the second program voltage VPGM2 is higher than the first program voltage VPGM1 by a predetermined level. After that, the nonvolatile memory device 120 may apply the first through seventh verify voltages (Vv_1 to Vv_7) to the selected word line and apply the pass voltage VPASS to the unselected word line.

The nonvolatile memory device 120 may perform the first through k-th program loops (PGM1 to PGMk) in a manner similar to that described above. In the case where a program verification with respect to memory cells is completed during performance of the first through k-th program loops (PGM1 to PGMk), a general program operation may be finished.

As described above, the memory controller 110 may perform a general erase operation and a general program operation in response to a write command from the host 11. The general erase operation indicates an operation of making memory cells of the memory block BLK to have an erase state E. The general program operation indicates an operation of making some (i.e., memory cells connected to the selected word line) of the memory cells of the memory block BLK to have any of the multiple different available program states. As described above, the general erase operation may include multiple erase loops and the general program operation may include multiple program loops.

Figure 10:
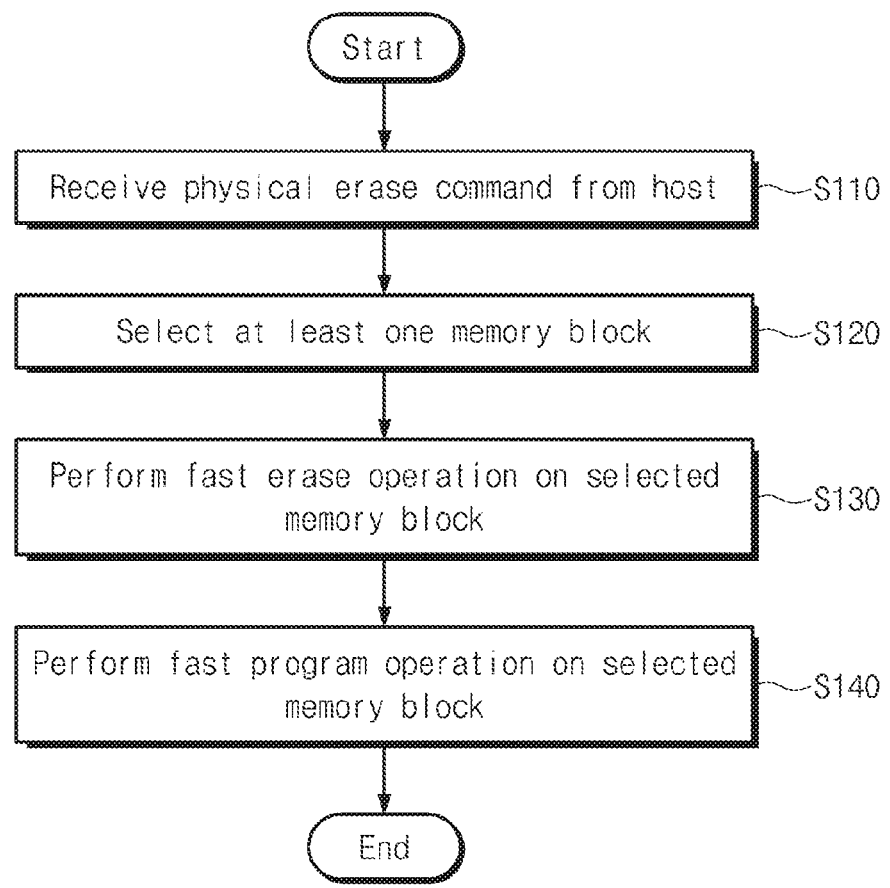
FIG. 10 is a flowchart illustrating an operation of a nonvolatile memory system in accordance with example embodiments of the present disclosure.

FIG. 10 is a flowchart illustrating an operation of a nonvolatile memory system in accordance with example embodiments of the present disclosure. It is assumed that a memory block selected by a physical erase command is the memory block BLK described with reference to FIG. 5. However, a memory block selected by a physical erase command is not limited thereto.

To clearly describe a characteristic of the present disclosure, the fast erase operation and the fast program operation are described by comparing with the general erase operation and the general program operation described already.

Referring to FIGS. 1 and 10, in an operation S110, the memory controller 110 may receive a physical erase command from the host 11. As described above, the physical erase command indicates an erase command for physically (actually) erasing data in the nonvolatile memory device 120 such as a sanitize command, a secure erase command, etc.

In an operation S120, the memory controller 110 may select at least one memory block. For example, the physical erase command received from the host 11 may include information (e.g., a block address) about a memory block to be physically erased. The memory controller 110 may select at least one of the memory blocks of the nonvolatile memory device 120 based on the information about the memory block to be physically erased.

In an operation S130, the memory controller 110 may perform a fast erase operation with respect to the selected memory block. For example, as described with reference to FIG. 1, the memory controller 110 may perform the fast erase operation in response to the physical erase command from the host 11. The fast erase operation may indicate an operation of erasing the selected memory block so that memory cells of the selected memory block have a threshold voltage state which is not an erase state. Memory cells of the memory block on which the fast erase operation is performed may have a threshold voltage distribution of an erase state or a fast erase state.

In example embodiments, the memory controller 110 may provide a fast erase command for the fast erase operation to the nonvolatile memory device 120. The nonvolatile memory device 120 may perform the fast erase operation in response to the fast erase command. The fast erase command may be a signal predefined by an interface between the memory controller 110 and the nonvolatile memory device 120. The fast erase command may be a different signal from the general erase command described with reference to FIG. 6.

In an operation S140, the memory controller 110 may perform a fast program operation with reference to the selected memory block. As described with reference to FIG. 1, the fast program operation, unlike the general program operation, may indicate an operation of programming memory cells of the selected memory block to have a fast program state.

In example embodiments, the memory controller 110 may provide a fast program command for the fast program operation to the nonvolatile memory device 120. The nonvolatile memory device 120 may perform the fast program operation in response to the fast program command The fast program command may be a signal predefined by an interface between the memory controller 110 and the nonvolatile memory device 120. The nonvolatile memory device 120 may perform the fast erase operation and the fast program operation in response to the fast erase command.

A conventional memory controller performs a general erase operation such as described with reference to FIGS. 7 and 8 in response to a physical erase command from a host. Unlike this, the memory controller 110 performs the fast erase operation with respect to the selected memory block in response to the physical erase command from the host 11 and then may perform the fast program operation. The time taken to perform the fast erase operation and the fast program operation is smaller than the time taken to perform the general erase operation and the general program operation. Thus, operation latency due to the physical erase command is reduced. As a result, a nonvolatile memory system having improved performance is provided.

Figure 11:
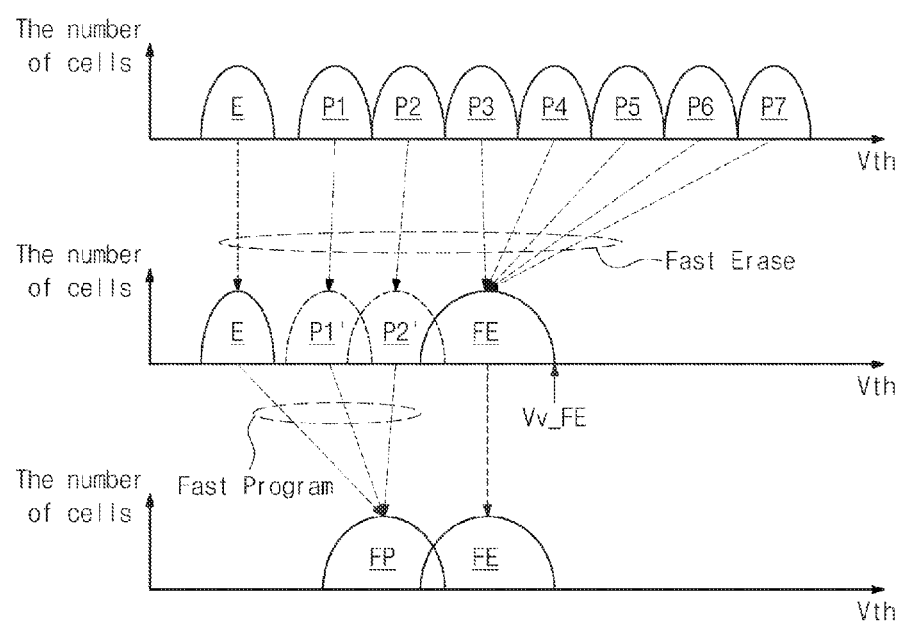
FIG. 11 illustrates a threshold voltage distribution of memory cells for explaining an operation of FIG. 10.

FIG. 11 is a threshold voltage distribution of memory cells for explaining an operation of FIG. 10. Each of X axes indicates a threshold voltage Vth and each of Y axes indicates the number of memory cells.

Referring to FIGS. 1, 5, 10 and 11, as described in the operation S130, the memory controller 110 may perform a fast erase operation with respect to the memory block BLK.

For example, each of memory cells of the memory block BLK may have any one of the erase state E and the first through seventh program states P1 to P7. The memory controller 110 may control the nonvolatile memory device 120 so that each of memory cells of the memory block BLK has one of the erase state E, a fast erase state FE, and program states P1' and P2'.

More specifically, the nonvolatile memory device 120 may perform the fast erase operation with respect to the memory block BLK under the control of the memory controller 110. In this case, the nonvolatile memory device 120 may apply the fast erase voltage to the substrate. A threshold voltage of memory cells of the memory block BLK may be changed by the fast erase voltage. Some (e.g., memory cells having program states of P3 to P7) memory cells of the memory block BLK may have the fast erase state FE by applying a voltage (i.e., a fast erase voltage) lower than the erase voltage VE used in the general erase operation to the substrate.

The general erase operation described with reference to FIGS. 7 and 8 indicates an operation of making memory cells of the memory block BLK to have the erase state E. However, the fast erase operation described with reference to FIG. 11 indicates an erase operation of making some (not all) of the memory cells of the memory block BLK to have the fast erase state FE. In this case, a lower bound value of a threshold voltage distribution of the fast erase state FE is greater than an upper bound value of a threshold voltage distribution of the erase state E. That is, the threshold voltage distribution of the fast erase state FE may not overlap the threshold voltage distribution of the erase state E.

After the fast erase operation is completed, the nonvolatile memory device 120 may perform the fast program operation under the control of the memory controller 110. In the case where the fast erase operation is completed, each of memory cells of the memory block BLK may have one of the erase state E, the fast erase state FE, and the program states P1' and P2'. The nonvolatile memory device 120 may program the memory cells of the memory block BLK at the same time so that the memory cells of the memory block BLK have one of the fast program state FP and the fast erase state FE.

That is, the fast erase operation may be performed such that some (e.g., memory cells having program states of P3~P7) of memory cells of the memory block BLK have the fast erase state FE. Then the fast program operation may be performed such that the remaining memory cells (e.g., memory cells having the ease state E and the program states P1' and P2') have the fast program state FP.

In the general program operation described with reference to FIGS. 7 and 9, a program voltage is applied to some (e.g., memory cells connected to a selected word line) of the memory cells of the memory block BLK. However, the fast program operation of FIG. 11 applies a fast program voltage to all the memory cells of the memory block BLK. This leads the memory cells of the memory block BLK to have the fast program state FP and the fast erase state FE.

As described above, in the case where the fast erase operation and the fast program operation are performed, each of the memory cells of the memory block BLK may have the fast program state FP and the fast erase state FE. In this case, data stored in the memory block BLK before the erase operation may not be read out. Deterioration of the memory cells due to neglected time after the erase operation may be prevented by programming the memory cells with a specific pattern which is not the erase state E.

The threshold voltage distribution of the fast program state FP and the fast erase state FE in FIG. 11 are illustrative and threshold voltage distributions are not limited thereto. For example, an upper bound value of a threshold voltage distribution of the fast erase state FE may be greater than an upper bound value of a threshold voltage distribution of the erase state E. An upper bound value of a threshold voltage distribution of the fast program state FP may also be greater than an upper bound value of a threshold voltage distribution of the fast erase state FE. The fast program state FP and the fast erase state FE may have the same threshold voltage distribution.

The threshold voltage distribution of the fast program state FP and the fast erase state FE may be variously changed depending on a physical characteristic or a location of the memory block BLK.

Figure 12:
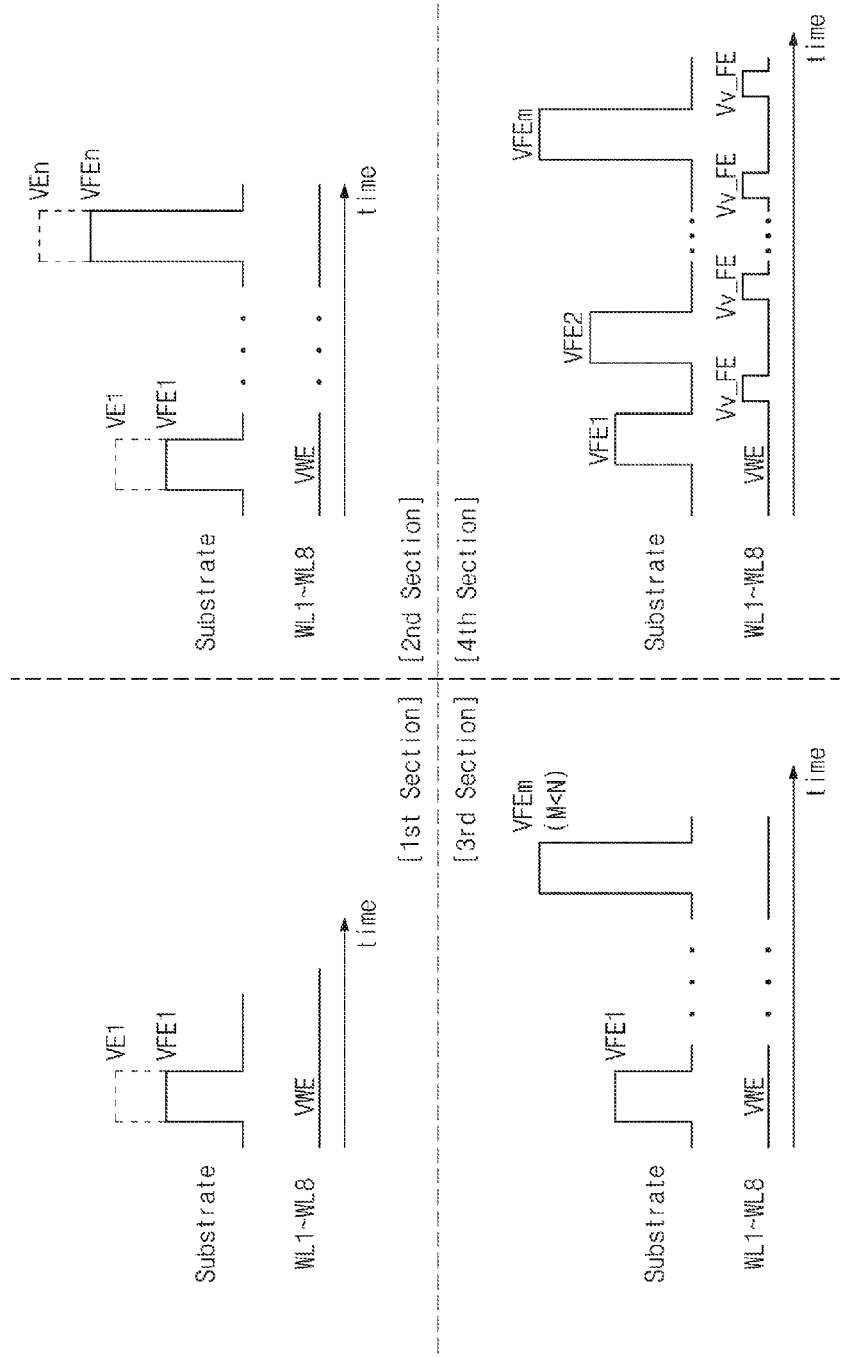
FIG. 12 illustrates views of examples of a fast erase operation.

FIG. 12 illustrates exemplary views of a fast erase operation. For clarity of description, a fast erase operation is described by comparing with the erase voltage VE of the general erase operation of FIG. 8.

Referring to FIGS. 8 and 12, as illustrated in the first section of FIG. 12, in the fast erase operation, a first fast erase voltage VFE1 is applied to the substrate and the word line erase voltage VWE is applied to the word lines (WL1 to WL8). The fast erase operation may be completed by applying only the first fast erase voltage VFE1 to the substrate once without an erase verify operation while the general erase operation performs multiple erase loops. The first fast erase voltage VFE1 may be lower than the first erase voltage VE1 of the general erase operation. The first fast erase voltage VFE1 may be a voltage level predetermined according to a physical characteristic and a physical location of the memory block BLK or the memory cells.

As illustrated in a second section of FIG. 12, in the fast erase operation, first through nth fast erase voltages (VFE1 to VFEn) may be applied to the substrate and the word line erase voltage VWE may be applied to the word lines (WL1 to WL8). The first through nth fast erase voltages (VFE1 to VFEn) may be lower than the first through nth erase voltages (VE1 to VEn) of the general erase operation respectively. An erase voltage increment in the fast erase operation may be smaller than an erase voltage increment in the general erase operation. That is, unlike the first section, in the first erase operation of the second section, multiple fast erase voltages may be sequentially applied. In this case, an erase verify operation is omitted like the first section.

As illustrated in a third section of FIG. 12, in the fast erase operation, first through m-th fast erase voltages (VFE1 to VFEm) may be sequentially applied to the substrate and the word line erase voltage VWE may be applied to the word lines (WL1 to WL8). Here, m is an integer smaller than n. The number (i.e., erase loop count) of times that the fast erase voltage is applied in the fast erase operation may be smaller than the number (i.e., erase loop count) of times that the erase voltage is applied in the general erase operation. In this case, an erase verify operation may be omitted.

As illustrated in a fourth section of FIG. 12, in the fast erase operation, the first through m-th fast erase voltages (VFE1 to VFEm) may be sequentially applied to the substrate. Unlike that described with reference to the first through third sections, in the fourth section, a fast erase verify operation may be performed. That is, after the first fast erase voltage VFE1 is applied to the substrate, a fast erase verify voltage Vv_FE may be applied to the word lines (WL1 to WL8). The fast erase verify voltage Vv_FE may be an upper bound value of a threshold voltage distribution of the fast erase state FE.

As described above, the fast erase operation may be performed in various different methods from the general erase operation. The fast erase operation described with reference to FIG. 12 is illustrative and fast erase operations are not limited thereto. For example, although not shown in the drawings, the first fast erase voltage VFE1 may be higher than the first erase voltage VE1. Also, the time taken for the fast erase voltage VFE to be applied, that is, a pulse width of the fast erase voltage VFE may be smaller than a pulse width of the erase voltage VE. The nonvolatile memory device 120 may perform the fast erase operation in various methods so that memory cells of the memory block BLK have the fast erase state FE according to a control of the memory controller 110.

Figure 13:
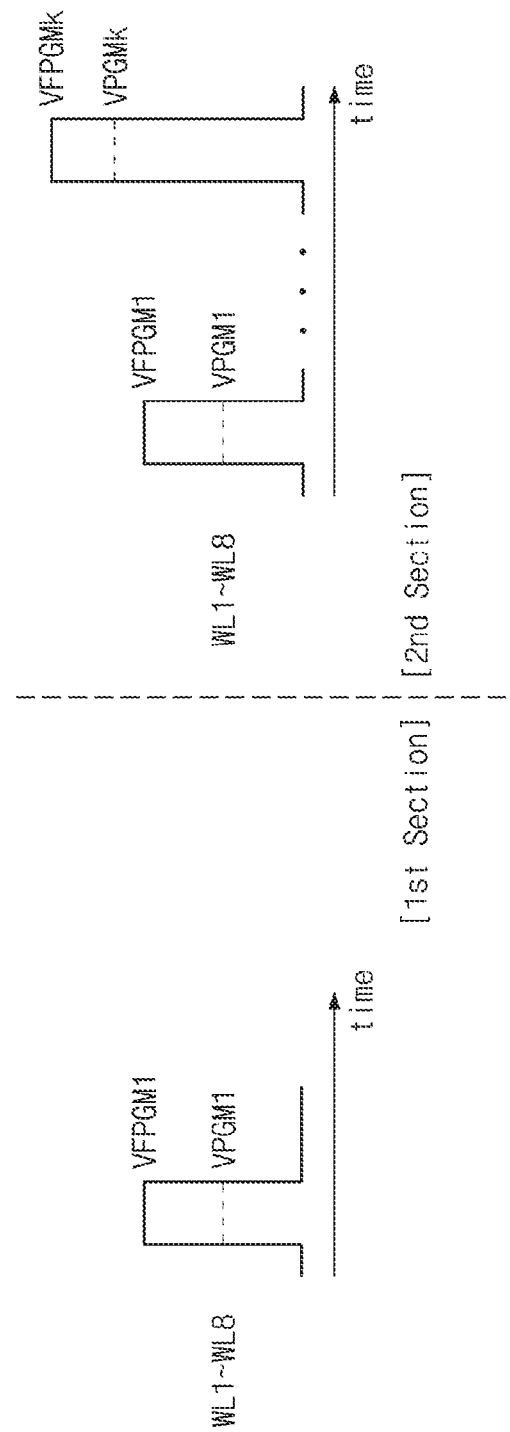
FIG. 13 is a graph for explaining a fast program operation.

FIG. 13 is a graph for explaining a fast program operation. For clarity of description, a fast program operation is described by comparing with the program voltage VPGM of the general program operation of FIG. 9.

Referring to FIGS. 5, 9 and 13, as illustrated in a first section, in the fast program operation, a first fast program voltage VFPGM1 is applied to the word lines (WL1 to WL8). Here, the first fast program voltage VFPGM1 may be higher than the first program voltage VPGM1 used in the general program operation. In this case, a separate verify operation may not be performed.

As illustrated in a second section, in the fast program operation, first through k-th fast program voltages (VFPGM1 to VFPGMk) may be applied to the word lines (WL1 to WL8). The first through k-th fast program voltages (VFPGM1 to VFPGMk) may be higher than the first through k-th program voltages (VPGM1 to VPGMk) used in the general program operation respectively. A program verify operation may not be performed separately.

The general program operation applies a program voltage to a selected word line so that memory cells connected to the selected word line have the erase state E and the program states (P1 to P7). That is, to precisely control a threshold voltage of the memory cells, the program voltage used in the general program operation increases from a low level to a high level by a predetermined level. However, the fast program operation applies a program voltage to word lines so that memory cells have the fast program state FP. A range of a threshold voltage distribution corresponding to the fast program state FP may be wider than that of each program state (P1 to P7). As a result, the fast program operation can rapidly program the memory cells to have the fast program state FP by applying a program voltage higher than that of the general program operation.

As described above, unlike the general program operation, in the fast program operation, a fast program voltage is applied to all the memory cells connected to the memory block BLK. Thus, the memory cells included in the memory block BLK may have the fast program state FP.

The fast program operation in FIG. 13 is illustrative and fast program operations are not limited thereto. For example, although not shown in the drawings, the first to k-th fast program voltages VFPGM1 to VFPGMk may be higher than the first to k-th program voltages VPGM1 to VPGMk, respectively. Also, the number (i.e., program loop count) of times that the fast program voltage is applied to word lines connected to the memory block BLK may be smaller than a program loop count of the general program operation. A level, a pulse width, etc. of the fast program voltage may be variously changed depending on a physical characteristic and a location of the memory cells.

According to example embodiments of the present disclosure, the nonvolatile memory system 100 receives a physical erase command from the host 11 and performs the fast erase operation and the fast program operation in response to the received physical erase command. Thus, since an operation latency according to the physical erase command is reduced, a nonvolatile memory system having improved performance and improved reliability is provided.

Figure 14:
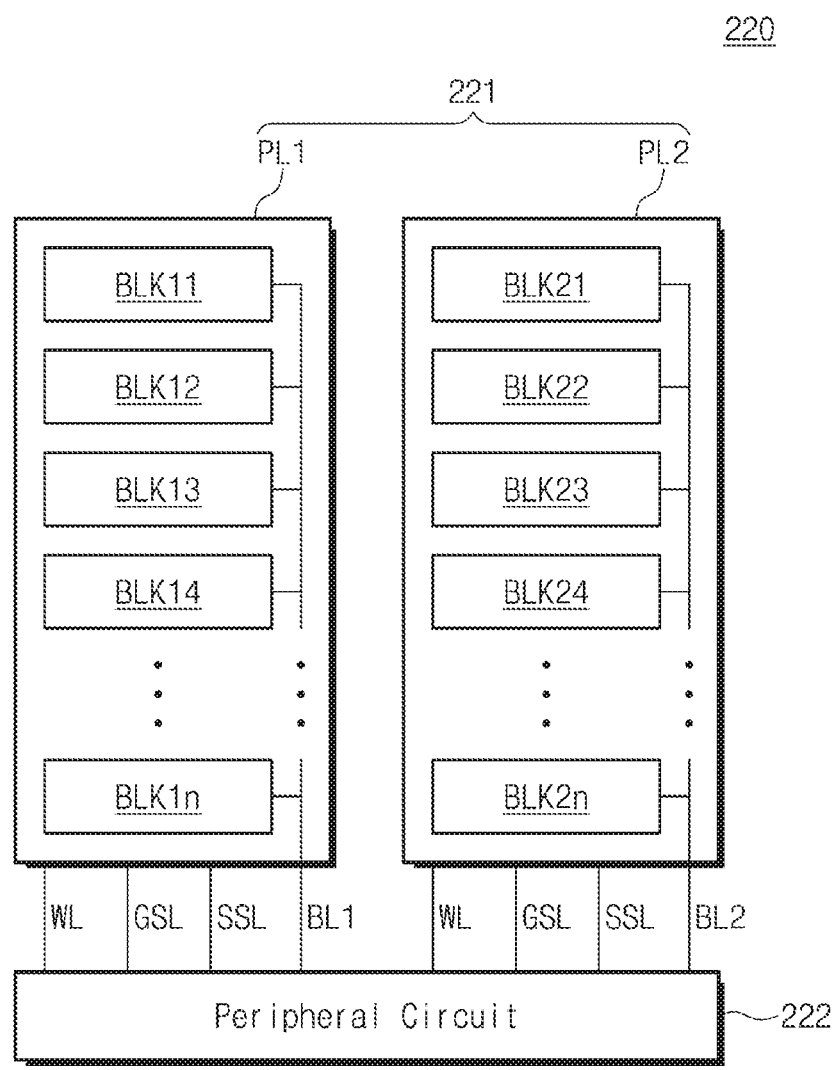
FIG. 14 is a block diagram illustrating another example of a nonvolatile memory device.

FIG. 14 is a block diagram illustrating another example of a nonvolatile memory device. Referring to FIG. 14, a nonvolatile memory device 200 includes a memory cell array 221 and a peripheral circuit 222.

The memory cell array 221 may be connected to the peripheral circuit 222 through word lines WL, ground select lines GSL, string select lines SSL, and bit lines BL1 and BL2. The peripheral circuit 222 may include the address decoder 122, the control logic and voltage generating circuit 123, the page buffer 124, and the input/output circuit 125 that were described with reference to FIG. 4.

The memory cell array 221 includes first and second planes PL1 and PL2. Each of the first and second planes PL1 and PL2 may include memory blocks (BLK11 to BLK1n, BLK21 to BLK2n). The memory blocks (BLK11 to BLK1n) included in the first plane P1 share bit lines BL1. The memory blocks (BLK21 to BLK2n) included in the second plane P2 share bit lines BL2.

The nonvolatile memory device 220 may perform the fast erase operation and the fast program operation described with reference to FIGS. 1 to 13 under the control of the memory controller 110. In this case, the nonvolatile memory device 220 may perform the fast erase operation and the fast program operation with respect to at least two memory blocks at the same time under the control of the memory controller 110.

For example, the nonvolatile memory device 220 may perform the fast erase operation with respect to at least two memory blocks (e.g., BLK11, BLK12, BLK13) included in the same plane (e.g., first plane P1) at the same time. That is, the fast erase operation may be performed with respect to the memory blocks (BLK11, BLK12, BLK13) at the same time by applying a fast erase voltage to a substrate and applying a word line erase voltage to the memory blocks (BLK11, BLK12, BLK13).

As described above, the nonvolatile memory system according to the present disclosure may perform the fast erase operation and the fast program operation with respect to multiple memory blocks in response to the physical erase command from the host. Thus, since latency with respect to the fast erase command is reduced, a nonvolatile memory system having improved performance is provided.

Although not illustrated in the drawing, the nonvolatile memory system according to the present disclosure may perform the fast program operation with respect to the memory blocks in response to the physical erase command from the host and then perform the fast erase operation.

Figure 15:
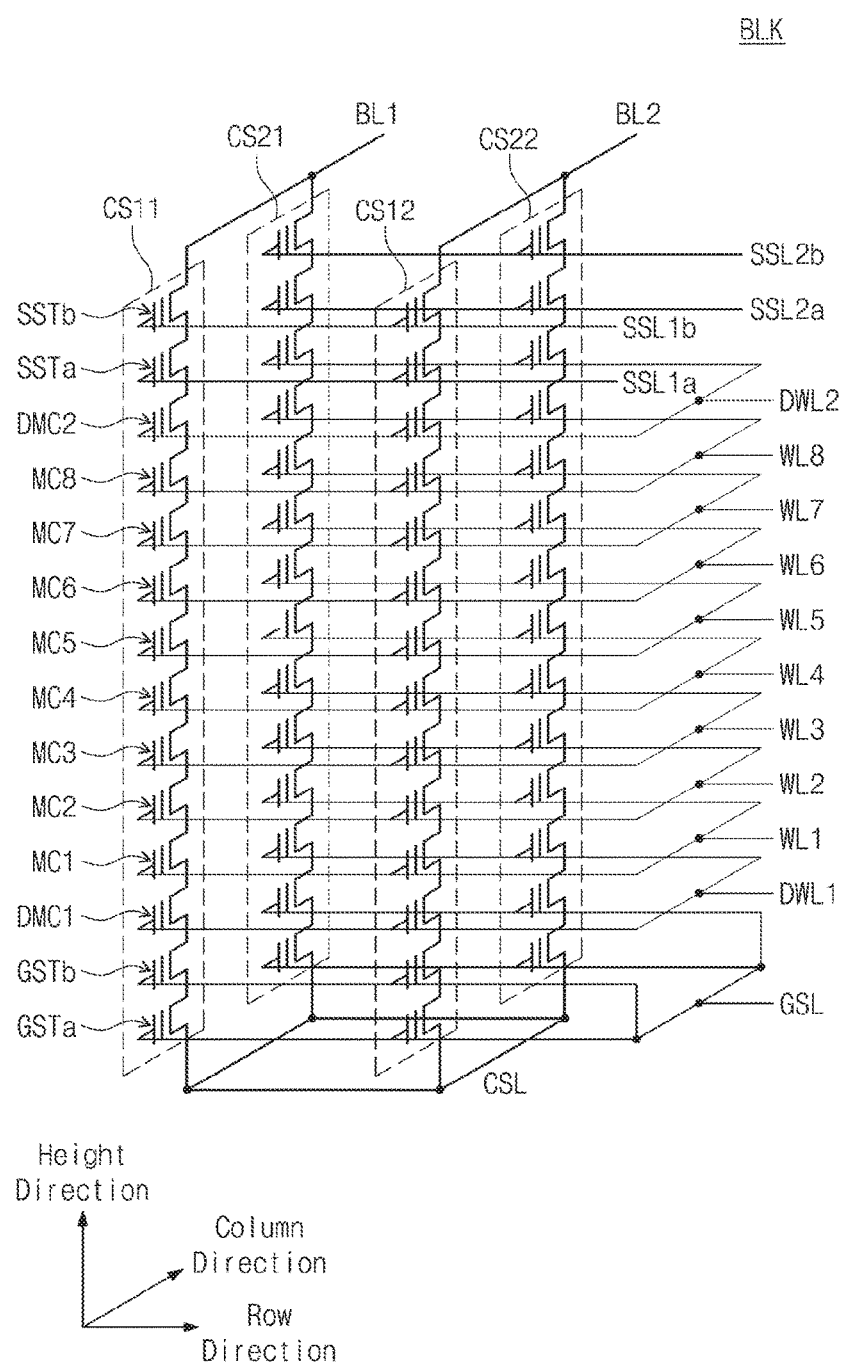
FIG. 15 is a circuit diagram illustrating a three-dimensional structure of a memory block in accordance with example embodiments of the present disclosure.

FIG. 15 is a circuit diagram illustrating a three-dimensional structure of a memory block in accordance with example embodiments of the present disclosure. In FIG. 15, although one memory block BLK is illustrated, the present disclosure is not limited thereto. The nonvolatile memory device according to the present disclosure may further include memory blocks having a similar structure to that illustrated in FIG. 15. The nonvolatile memory device may perform the fast erase operation and the fast program operation with respect to the memory block BLK illustrated in FIG. 15.

Referring to FIG. 15, the memory block BLK includes multiple cell strings (CS11, CS12, CS21, CS22). The cell strings (CS11, CS12, CS21, CS22) are arranged along a row direction and a column direction to form rows and columns Each of the cell strings (CS11, CS12, CS21, CS22) includes multiple cell transistors. For example, each of the cell strings (CS11, CS12, CS21, CS22) may include string select transistors (SSTa, SSTb), multiple memory cells (MC1~MC8), ground select transistors (GSTa, GSTb) and dummy memory cells (DMC1, DMC2). Each of the transistors included in the cell strings (CS11, CS12, CS21, CS22) may be a CTF (charge trap flash) memory cell.

The memory cells (MC1~MC8) are serially connected to one another and are laminated in a height direction which is a direction perpendicular to a plane formed by a row direction and a column direction. The string select transistors (SSTa, SSTb) are serially connected to each other. The serially connected string select transistors (SSTa, SSTb) are provided between the memory cells (MC1~MC8) and the bit line BL. The ground select transistors (GSTa, GSTb) are serially connected to each other. The serially connected ground select transistors (GSTa, GSTb) are provided between the memory cells (MC1~MC8) and a common source line CSL.

A first dummy memory cell DMC1 may be provided between the memory cells (MC1~MC8) and the ground select transistors (GSTa, GSTb). A second dummy memory cell DMC2 may be provided between the memory cells (MC1~MC8) and the string select transistors (SSTa, SSTb).

The ground select transistors (GSTa, GSTb) of the cell strings (CS11, CS12, CS21, CS22) may be connected to a ground select line GSL in common. Ground select transistors of the same row may be connected to the same ground select line. Ground select transistors of different rows may be connected to different ground select lines. For example, the first ground transistors GSTa of the cell strings (CS11, CS12) of the first row may be connected to a first ground select line. The first ground transistors GSTa of the cell strings (CS21, CS22) of the second row may be connected to a second ground select line.

Although not illustrated in the drawing, ground select transistors provided at the same height from a substrate (not illustrated) may be connected to the same ground select line. Ground select transistors provided at different heights may be connected to different ground select lines. For example, the first ground transistors GSTa of the cell strings (CS11, CS12, CS21, CS22) may be connected to the first ground select line. The second ground transistors GSTb of the cell strings (CS11, CS12, CS21, CS22) may be connected to the second ground select line.

Memory cells of the same height from the substrate or the ground select transistors (GSTa, GSTb) are connected to the same word line in common. Memory cells of different heights are connected to different word lines. For example, the first through eighth memory cells (MC1~MC8) of the cell strings (CS11, CS12, CS21, CS22) are connected to the first through eighth word lines (WL1~WL8) respectively in common.

String select transistors of the same row among the first string select transistors SSTa of the same height are connected to the same string select line. String select transistors of different rows are connected to different string select lines. For example, the first string select transistors SSTa of the cell strings (CS11, CS12) of the first row are connected to the string select line SSL1a in common. The first string select transistors SSTa of the cell strings (CS21, CS22) of the second row are connected to the string select line SSL2a in common.

Similarly, string select transistors of the same row among the second string select transistors SSTb of the same height are connected to the same string select line. String select transistors of different rows are connected to different string select lines. For example, the second string select transistors SSTb of the cell strings (CS11, CS12) of the first row are connected to the string select line SSL1b in common. The second string select transistors SSTb of the cell strings (CS21, CS22) of the second row are connected to the string select line SSL2b in common.

Dummy memory cells of the same height are connected to the same dummy word line and dummy memory cells of different heights are connected to different dummy word lines respectively. For example, the first dummy memory cell DMC1 is connected to a first dummy word line DWL1 and the second dummy memory cells DMC2 are connected to a second dummy word line DWL2.

The memory block BLK in FIG. 15 is illustrative. The number of cell strings may increase or decrease. The number of rows and columns constituted by cell strings may increase or decrease depending on the number of the cell strings. Also, the number of the cell transistors (GST, MC, DMC, SST) of the memory block BLK may increase or decrease. A height of the memory block BLK may increase or decrease depending on the number of the cell transistors (GST, MC, DMC, SST). The number of the lines (GSL, WL, DWL, SSL) connected to the cell transistors (GST, MC, DMC, SST) may increase or decrease depending on the number of the cell transistors (GST, MC, DMC, SST).

The nonvolatile memory device according to the present disclosure is not limited to the configuration described above. The nonvolatile memory device may include a three dimensional (3D) memory array. The 3D memory array is monolithically formed in one or more physical levels of arrays of memory cells and circuitry. The memory cells have an active area disposed above a silicon substrate. The circuitry is associated with the operation of the memory cells, whether such associated circuitry is above or within such substrate. The term "monolithic" means that layers of each level of the array are directly deposited on the layers of each underlying level of the array.

In an embodiment of the present disclosure, the 3D memory array includes vertical NAND strings that are vertically oriented such that at least one memory cell is located over another memory cell. The at least one memory cell may comprise a charge trap layer. Each vertical NAND string may include at least one select transistor located over memory cells, the at least one select transistor having the same structure with the memory cells and being formed monolithically together with the memory cells.

The following patent documents, which are hereby incorporated by reference, describe suitable configurations for three-dimensional memory arrays, in which the three-dimensional memory array is configured as multiple levels, which word lines and/or bit lines shared between levels: U.S. Pat. Nos. 7,679,133; 8,553,466; 8,654,587; 8,559,235; and US Pat. Pub. No. 2011/0233648.

Figure 16:
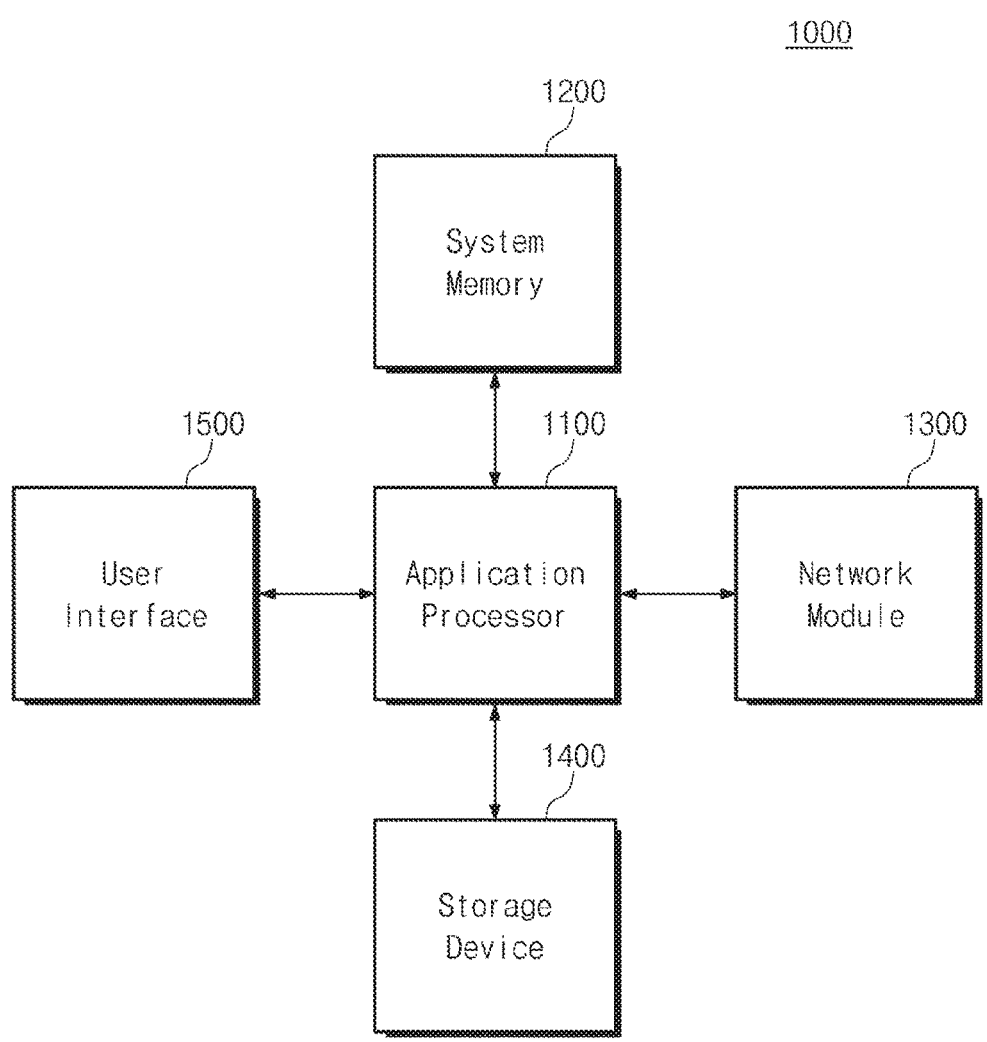
FIG. 16 is a block diagram illustrating a user system that includes a nonvolatile memory system in accordance with example embodiments of the present disclosure.

FIG. 16 is a block diagram illustrating a user system that includes a nonvolatile memory system in accordance with example embodiments of the present disclosure. Referring to FIG. 16, a user system 1000 includes an application processor 1100, a system memory 1200, a network module 1300, a storage device 1400 and a user interface 1500.

The application processor 1100 can drive constituent elements and an operating system (OS) that are included in the user system 1000. The application processor 1100 may include controllers that controls constituent elements included in the user system 1000, a graphic engine, and various interfaces. The application processor 1100 may be provided in the form of a system-on-chip (SoC).

The system memory 1200 may operate as a main memory, an operation memory, a buffer memory or a cache memory. The system memory 1200 may include a volatile random access memory such as DRAM, SDRAM, DDR SDRAM, DDR2 SDRAM, DDR3 SDRAM, LPDDR SDRAM, LPDDR2 SDRAM, LPDDR3 SDRAM, etc. or a nonvolatile random access memory such as PRAM, ReRAM, MRAM, FRAM, etc. The system memory 1200 and the application processor 1100 may be embodied in a single package.

The network module 1300 may perform a communication with external devices. The network module 1300 may support a wireless communication under protocols or standards such as CDMA (code division multiple access), GSM (global system for mobile communication), WCDMA (wideband CDMA), CDMA-2000, TDMA (time division multiple access), LTE (long term evolution), Wimax, WLAN, UWB, blue tooth, WI-DI, etc. The network module 1300 may be included in the application processor 1100.

The storage device 1400 may store data according to a control of the application processor 1100. For example, the storage device 1400 may store data received from the application processor 1100. The storage device 1400 may transmit data stored in the storage device 1400 to the application processor 1100. The storage device 1400 may be embodied by a semiconductor memory device such as a PRAM (phase-change RAM), a MRAM (magnetic RAM), a RRAM (resistive RAM), a NAND flash, a NOR flash, a three-dimensional NAND flash, etc. The storage device 1400 may include the memory controller and the nonvolatile memory device described with reference to FIGS. 1 through 15 and may operate based on the operation method described with reference to FIGS. 1 through 15.

The user interface 1500 may include interfaces that input data or a command into the application processor 1100 or output data to an external device. The user interface 1500 may include user input interfaces such as a keyboard, a key pad, a button, a touch panel, a touch screen, a touch pad, a touch ball, a camera including an image sensor, a microphone, a gyroscope sensor, a vibration sensor, a piezoelectric element, etc. The user interface 1500 may include user output interfaces such as a liquid crystal display (LCD), an organic light emitting diode (OLED) display device, an active crystal display (AMOLED) display device, a LED, a speaker, a motor, etc.

According to example embodiments of the present disclosure, the nonvolatile memory system performs the fast erase operation and the fast program operation with respect to at least one memory block in response to a physical erase command from an external device (i.e., host). Accordingly, since the time taken to physically erase memory cells is reduced in comparison with a conventional general erase operation, a nonvolatile memory system having improved performance is provided.

The nonvolatile memory system according to example embodiments of the present disclosure performs the fast erase operation and the fast program operation in response to a physical erase command from an external device. According to example embodiments of the present disclosure, an operation method of a nonvolatile memory system having improved performance and an operation method of a nonvolatile memory device having improved performance are provided.

The above-disclosed subject matter is to be considered illustrative, and not restrictive. The appended claims are intended to cover all such modifications, enhancements, and other embodiments, which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. An operation method of a nonvolatile memory system that includes a nonvolatile memory device and a memory controller that controls the nonvolatile memory device, wherein the nonvolatile memory device comprises a plurality of memory blocks, each of the memory blocks comprises memory cells, and each of the memory cells has any one of an erase state and a plurality of program states, wherein the method comprises:

receiving a physical erase command from an external device;

performing a fast erase operation, responsive to the received physical erase command, with respect to at least one memory block of a plurality of memory blocks of the nonvolatile memory device so that first memory cells of the at least one memory block have a fast erase state different from the erase state, and performing a fast program operation with respect to the at least memory block so that second memory cells of the at least one memory block have a fast program state, wherein an upper bound value of a threshold voltage distribution of the fast program state is smaller than an upper bound value of a threshold voltage distribution of the fast erase state.

2. The operation method of claim 1, wherein a lower bound value of a threshold voltage distribution of the fast erase state is greater than an upper bound value of a threshold voltage distribution of the erase state, and wherein an upper bound value of a threshold voltage distribution of the fast erase state is smaller than an upper bound value of a threshold voltage distribution of an uppermost program state of the plurality of program states.

3. The operation method of claim 1,
wherein the performing the fast program operation further comprises applying a fast program voltage to word lines connected to the at least one memory block.

4. The operation method of claim 1, further comprising:
receiving a write command from the external device;
performing a general erase operation with respect to a first memory block so that memory cells of the first memory block have the erase state responsive to the received write command; and
performing a general program operation with respect to a plurality of the memory cells of the first memory block.

5. The operation method of claim 4,
wherein a first erase verify voltage applied to a word line connected to the at least one memory block in the fast erase operation is higher than a second erase verify voltage applied to word lines connected to the first memory block in the general erase operation.

6. The operation method of claim 4,
wherein a first erase start voltage applied to a substrate in the fast erase operation is lower than a second erase start voltage applied to the substrate in the general erase operation.

7. The operation method of claim 4,
wherein each of the fast erase operation and the general erase operation comprises a plurality of erase loops, and
wherein a number of erase loops of the fast erase operation is smaller than a number of erase loops of the general erase operation.

8. The operation method of claim 1,
wherein the at least one memory block comprises at least two memory blocks sharing the same bit lines.

9. The operation method of claim 1,
wherein the at least one memory block comprises a three-dimensional memory structure laminated in a direction perpendicular to a substrate.

10. An operation method of a nonvolatile memory system that includes a nonvolatile memory device including memory blocks and a memory controller that controls the nonvolatile memory device, the method comprising:
receiving a physical erase command from an external device;
performing a first erase operation with respect to first memory blocks responsive to the received physical erase command;
performing a fast program operation with respect to the first memory blocks responsive to the received physical erase command;
receiving a write command from the external device; and
performing a second erase operation different from the first erase operation with respect to the first memory blocks responsive to the received write command,
wherein all or fewer than all memory cells of the first memory blocks have a first threshold voltage distribution, each of a plurality of memory cells of the first memory blocks on which the fast program operation is performed has any one of the first threshold voltage distribution and a third threshold voltage distribution, and all memory cells of the first memory blocks on which the second erase operation is performed have a second threshold voltage distribution.

11. The operation method of claim 10,
wherein a lower bound value of the first threshold voltage distribution is greater than an upper bound value of the second threshold voltage distribution.

12. The operation method of claim 10,
wherein a lower bound value of the third threshold voltage distribution is greater than an upper bound value of the second threshold voltage distribution.

13. The operation method of claim 12,
wherein the performing the fast program operation comprises applying a program voltage to word lines connected to the first memory blocks at the same time.

14. The operation method of claim 10, after the second erase operation is performed, further comprising:
performing a normal program operation with respect to a plurality of memory cells of the first memory block,
wherein after the normal program operation is completed, each of a plurality of memory cells of the first memory block has one of an erase state and any one of a plurality of program states.

15. A method of operating a nonvolatile memory device, comprising:
receiving a first command from an external device, and performing an erase operation responsive to the first command that results in placing all memory cells of a memory block of the nonvolatile memory device into an erase state; and
receiving a second command from the external device, and performing a fast erase operation and a fast program operation responsive to the second command, and independent of the first command, that results in placing each of memory cells of a memory block of the nonvolatile memory device into one of a fast program state or a fast erase state different from the erase state.

16. The method of claim 15, further comprising:
after performing the erase operation responsive to the first command, performing a normal program operation on memory cells connected to a selected word line among all memory cells of the memory block of the nonvolatile memory device placed into the erase state.

17. The method of claim 16, further comprising:
after performing the fast erase operation responsive to the second command, performing a fast program operation with respect to remaining memory cells of the memory block placed into the fast erase state so that fewer than all memory cells of the memory block have the fast program state.

18. The method of claim 15,
wherein the first command comprises a write command received from the external device;
wherein the second command comprises a physical erase command received from the external device,
wherein each of the first command and the second command result in performing a plurality of erase loops, and
wherein a number of erase loops responsive to the second command is smaller than a number of erase loops responsive to the first command.

19. The method of claim 15, wherein
wherein a lower bound value of a threshold voltage distribution of the fast erase state is greater than an upper bound value of a threshold voltage distribution of the erase state, and
a lower bound value of a threshold voltage distribution of the fast program state is greater than an upper bound value of a threshold voltage distribution of the erase state.

* * * * *